(12) United States Patent
Hazama

(10) Patent No.: US 6,339,548 B1
(45) Date of Patent: *Jan. 15, 2002

(54) DATA READING METHOD IN SEMICONDUCTOR STORAGE DEVICE CAPABLE OF STORING THREE- OR MULTI-VALUED DATA IN ONE MEMORY CELL

(75) Inventor: Katsuki Hazama, Tokyo (JP)

(73) Assignee: Nippon Steel Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/642,081

(22) Filed: Aug. 21, 2000

Related U.S. Application Data

(62) Division of application No. 08/890,600, filed on Jul. 9, 1997, now Pat. No. 6,144,585, which is a division of application No. 08/604,447, filed on Feb. 21, 1996, now Pat. No. 5,682,347, which is a division of application No. 08/362,785, filed on Dec. 23, 1994, now Pat. No. 5,515,321.

(30) Foreign Application Priority Data

Dec. 28, 1993 (JP) ............................. 5-351867

(51) Int. Cl.⁷ ............................................. G11C 11/34
(52) U.S. Cl. .............................. 365/185.22; 365/185.21
(58) Field of Search .................. 365/185.22, 185.21, 365/185.17, 185.18, 185.24, 185.03

(56) References Cited

U.S. PATENT DOCUMENTS

| | | | |
|---|---|---|---|
| 5,163,021 A | * 11/1992 | Mehrota | 365/168 |
| 5,200,920 A | * 4/1993 | Norman | 365/185.19 |
| 5,218,569 A | * 6/1993 | Banks | 365/45 |
| 5,321,699 A | 6/1994 | Endoh et al. | 371/21.5 |
| 5,386,422 A | 1/1995 | Endoh et al. | 371/21.5 |
| 5,412,601 A | * 5/1995 | Sawada | 365/184 |
| 5,424,978 A | * 6/1995 | Wada | 365/184 |
| 5,469,444 A | 11/1995 | Endoh et al. | 371/215 |
| 5,485,422 A | 1/1996 | Bauer et al. | 365/168 |
| 5,497,354 A | 3/1996 | Sweha et al. | 365/230.06 |
| 5,539,690 A | 7/1996 | Talreja et al. | 365/185.22 |
| 5,594,691 A | 1/1997 | Bashir | 365/189.09 |
| 5,602,789 A | * 2/1997 | Endoh | 365/185.17 |
| 5,748,546 A | 5/1998 | Bauer et al. | 365/210 |

OTHER PUBLICATIONS

Morris, Logic Circuits, 1983, McGraw–Hill, p. 242, line 1 –p. 249, line 9.

Rich, A survey of Multivalued Memories, IEEE Transactions on Computers, vol. 35, No. 2, Feb. 1986, pp. 99–106.

Krick, Three–State MNOS FET Memory Array, IBM Technical Disclosure Bulletin vol. 18, No. 12, May 1976, pp. 4192–4193.

Horiguchi, et al., An Experimental Large–Capacity Semi–conductor File Memory Using 16–level/cell Storage, IEEE Journal of Solid–State Circuits, vol. 23, No. 1, Feb., 1988, pp. 27–33.

* cited by examiner

*Primary Examiner*—A. Zarabian
(74) *Attorney, Agent, or Firm*—Connolly, Bove, Lodge & Hutz LLP

(57) ABSTRACT

A data reading method in a semiconductor storage device capable of storing three- or multi-valued data in one memory cell, in which the state of each memory cell is classified into a plurality of sets to thereby detect what set the present storage state of the memory cell belongs to. That is, several kinds of voltage values are applied to each memory cell to detect whether a current flows in the memory cell or not in accordance with the magnitude of the voltage values to thereby judge the present storage state of each memory cell.

41 Claims, 6 Drawing Sheets

DATA READING METHOD IN SEMICONDUCTOR STORAGE DEVICE CAPABLE OF STORING THREE- OR MULTI-VALUED DATA IN ONE MEMORY CELL

The present application is a divisional of U.S. patent application Ser. No. 08/890,600, filed Jul. 9, 1997, U.S. Pat. No. 6,144,585 which is a divisional of U.S. patent application Ser. No. 08/604,447, filed Feb. 21, 1996, now U.S. Pat. No. 5,682,347, issued on Oct. 28, 1997 which is a divisional of Ser. No. 08/362,785, filed Dec. 23,1994, now U.S. Pat. No. 5,515,321, issued on May 7,1996.

FIELD OF THE INVENTION

The present invention relates to a data reading method in a semiconductor storage device for storing three- or multi-valued data in one memory cell.

BACKGROUND OF THE INVENTION

In a semiconductor storage device such as an EEPROM (Electrically Erasable Programmable Read Only Memory), or the like, put into practical use at present, no storage state but two kinds of storage states "0" and "1" can be set in one memory cell, so that the storage capacity of one memory cell is one bit (=two values). On the contrary, there has been proposed a semiconductor storage device in which four kinds of storage states "00" to "11" are set in one memory cell so that one memory cell has the storage capacity of two bits (=four values).

Such a semiconductor storage device as mentioned above (hereinafter referred to as "multi-valued memory") will be described below referring to of an EEPROM as an example.

FIG. 6A is a schematic sectional view of a floating gate type memory cell 61 in a conventional EEPROM. In this drawing, a drain 63 and a source 64 constituted by n-type impurity diffusion layers respectively are formed in a surface region of a p-type silicon substrate 62 so that a channel region 70 is formed between the drain 63 and the source 64. Further, a bit line 65 formed by lamination and a source line 66 formed by lamination are electrically connected to the drain 63 and the source 64, respectively. Further, a tunnel insulating film 71 constituted by an $SiO_2$ film having a thickness of about 10 nm is formed on the channel region 70. A floating gate 67 constituted by low-resistance polysilicon, an interlayer insulating film 68 and a control gate (word line) 69 constituted by low-resistance polysilicon are formed successively on the tunnel insulating film 71. FIG. 6B is a connection diagram of this memory cell.

A method of writing four-valued data "00" to "11" into the memory cell 61 formed as described above and reading the data from the memory cell 61 will be described below.

Firstly, the case of writing will be described. When, for example, data "11" is to be written into the memory cell 61, the bit line 65 and the source line 66 are grounded and opened, respectively, and then a pulse voltage in a range of from about 10 v to about 15 V is applied to the control gate 69. By application of the pulse voltage, a potential is induced in the floating gate 67 so that a predetermined quantity of electric charges are injected into the floating gate 67 by Fowler-Nordheim tunnelling in accordance with the potential difference between the floating gate 67 and the drain 63. As a result, the threshold value of the gate voltage of the memory cell 61 increases to about 5 V. This state is defined as "11". When, for example, data "10", "01" or "00" is to be written into the memory cell, the threshold value of the gate voltage of the memory cell 61 can be set to be 3 V, 1 V or −1 V in the same manner as described above in the case of writing of data "11" while the voltage applied to the bit line 65 is selected to be 1 V, 2 V or 3 V.

Secondly, the case of reading will be described below. Generally, a field-effect transistor (FET) has such characteristic that a current flows across the source and drain of the FET if the voltage applied to the gate electrode of the FET is not lower than a threshold value in the case where a voltage is applied to the source or drain, while, on the contrary, no current flows across the source and drain of the FET if the voltage applied to the gate electrode of the FET is lower than the threshold value. Reading is executed by using this characteristic of the FET.

For example, a voltage of 1 V is applied to the bit line 65, while the source line 66 is set to 0 V. In this condition, voltages of 0 V, 2 V and 4 V are applied to the control gate 69 successively. If a current flows across the source and the drain when a voltage of 0 V is applied to the control gate 69, the threshold value of the gate voltage of the memory cell 61 is judged to be −1 V, and data "00" is therefore read out. On the other hand, if no current flows in the case of the gate voltage of 0 V but a current flows in the case of the gate voltage of 2 V, the threshold value of the gate voltage of the memory cell 61 is judged to be 1 V, and data "01" is therefore read out. Further, if no current flows in the case of the gate voltage of 0 V and in the case of the gate voltage of 2 V but a current flows first in the case of the gate voltage of 4 V, the threshold value of the gate voltage of the memory cell 61 is judged to be 3 V, and data "10" is therefore read out. Furthermore, if no current flows across the source and the drain in spite of the application of any of the above voltages to the control gate 69, the threshold value of the gate voltage of the memory cell 61 is judged to be 5 V, and data "11" is therefore read out.

Although the above description has been made regarding where four-valued information, that is, two-bit information is stored in one memory cell, researches have been made upon the case where multi-valued information capable of indicating more values than four is stored in one memory cell.

In the aforementioned data reading method in the conventional multi-valued memory, however, there arises a problem that the number of times of reading operation subjected to one memory cell increases.

When, for example, four-valued information is stored in one memory cell, three times of reading operation in the gate voltage values of 0 V, 2 V and 4 V is required as described above. Although reading is practically performed while a voltage changed stepwise to be 0 V, 2 V and 4 V is applied to the control gate, the fact that three times reading operation is required remains unchanged.

When n-valued ($n \geq 2$) information is stored in one memory cell, (n−1) times of reading operation is generally required in the conventional reading method. In expression in the number of bits, when k-bit ($k \geq 1$) information is stored in one memory cell, ($2^k-1$) times of reading operation is generally required in the conventional reading method.

SUMMARY OF THE INVENTION

It is therefore an object of the present invention to provide a reading method in a semiconductor storage device in which the number of times of reading operation subjected to a multi-valued memory is reduced so that read access time can be shortened.

In order to attain the above object, according to an aspect of the present invention, a data reading method in a semiconductor storage device provided with at least one memory cell which has a control gate and an electric charge accumulating layer so that a threshold value of a gate voltage of the memory cell is controlled to be one $V_{th}(i)$ (in which i is an integer of 1 to n) of a number n (n≧3) of different values to thereby store three- or multi-valued information in one memory cell, comprises the steps of: applying a voltage $V_1$ represented by a relation $V_{th}(m_1) \leq V_1 < V_{th}(m_1+1)$ to the control gate of the memory cell to thereby detect whether a current flows across source and drain of the memory cell, where $m_1$ represents a maximum of integers not larger than n/2; applying a voltage $V_2$ represented by a relation $V_{th}(m_2) \leq V_2 < V_{th}(m_2+1)$ to the control gate of the memory cell to thereby detect whether a current flows across the source and drain of the memory cell when a current flows because of application of the voltage $V_1$ where $m_2$ represents a maximum of integers not larger than n/4; and applying a voltage $V_3$ represented by a relation $V_{th}(m_3) \leq V_3 < V_{th}(m_3+1)$ to the control gate of the memory cell to thereby detect whether a current flows across the source and drain of the memory cell when no current flows in spite of application of the voltage $V_1$, where $m_3$ represents a maximum of integers not larger than 3n/4.

Preferably, in the case of n=4 the method comprises the steps of: applying a voltage $V_1$ represented by a relation $V_{th}(2) \leq V_1 < V_{th}(3)$ to the control gate of the memory cell to thereby detect whether a current flows across the source and drain of the memory cell applying a voltage $V_2$ represented by a relation $V_{th}(1) \leq V_2 < V_{th}(2)$ to the control gate of the memory cell to thereby detect whether a current flows across the source and drain of the memory cell when a current flows because of application of the voltage $V_1$; outputting storage information at a threshold value of the gate voltage of the memory cell of $V_{th}(1)$ when a current flows because of application of the voltage $V_2$; outputting storage information at a threshold value of the gate voltage of the memory cell of $V_{th}(2)$ when no current flows in spite of application of the voltage $V_2$; applying a voltage $V_3$ represented by a relation $V_{th}(3) \leq V_3 < V_{th}(4)$ to the control gate of the memory cell to thereby detect whether a current flows across the source and drain of the memory cell when no current flows in spite of application of the voltage $V_3$; outputting storage information at a threshold value of the gate voltage of the memory cell of $V_{th}(3)$ when a current flows because of application of the voltage $V_3$; and outputting storage information at a threshold value of the gate voltage of the memory cell of $V_{th}(4)$ when no current flows in spite of application of the voltage $V_3$.

Preferably, the electric charge accumulating layer is constituted by a floating gate.

According to another aspect of the present invention, a data reading method in a semiconductor storage device provided with at least one memory cell which is constituted by a field-effect transistor so that a threshold value of a gate voltage of the memory cell is controlled to be one $V_{th}(i)$ (in which i is an integer of 1 to n) of a number n (n≧3) of different values to thereby store three- or multi-valued information in one memory cell, comprises the steps of: applying a voltage $V_1$ represented by a relation $V_{th}(m_1) \leq V_1 < V_{th}(m_1+1)$ to a gate of the memory cell to thereby detect whether a current flows across source and drain of the memory cell where $m_1$ represents a maximum of integers not larger than n/2; applying a voltage $V_2$ represented by a relation $V_{th}(m_2) \leq V_2 < V_{th}(m_2+1)$ to the gate of the memory cell to thereby detect whether a current flows across the source and drain of the memory cell when a current flows because of application of the voltage $V_1$, where $m_2$ represents a maximum of integers not larger than n/4; and applying a voltage $V_3$ represented by a relation $V_{th}(m_3) \leq V_3 < V_{th}(m_3+1)$ to the gate of the memory cell to thereby detect whether a current flows across the source and drain of the memory cell or not when no current flows in spite of application of the voltage $V_1$, where $m_3$ represents a maximum of integers not larger than 3n/4.

According to a further aspect of the present invention, a data reading method in a semiconductor storage device provided with at least one memory cell which has a control gate and an electric charge accumulating layer so that a threshold value of a gate voltage of the memory cell is controlled to be one of a plurality of different values to thereby store three- or multi-valued data in one memory cell, comprises: a first step of applying a first voltage having a value larger than a predetermined one of the plurality of different values to the control gate of the memory cell to thereby detect whether a current flows across source and drain of the memory cell a second step of applying a second voltage having a value smaller than the value of the first voltage to the control gate of the memory cell to thereby detect whether a current flows across the source and drain of the memory cell when it is confirmed in the first step that a current flows; and a third step of applying a third voltage having a value higher than the value of the first voltage to the control gate of the memory cell to thereby detect whether a current flows across the source and drain of the memory cell when it is confirmed in the first step that no current flows.

DESCRIPTION OF THE PREFERRED EMBODIMENTS

Figure 2:
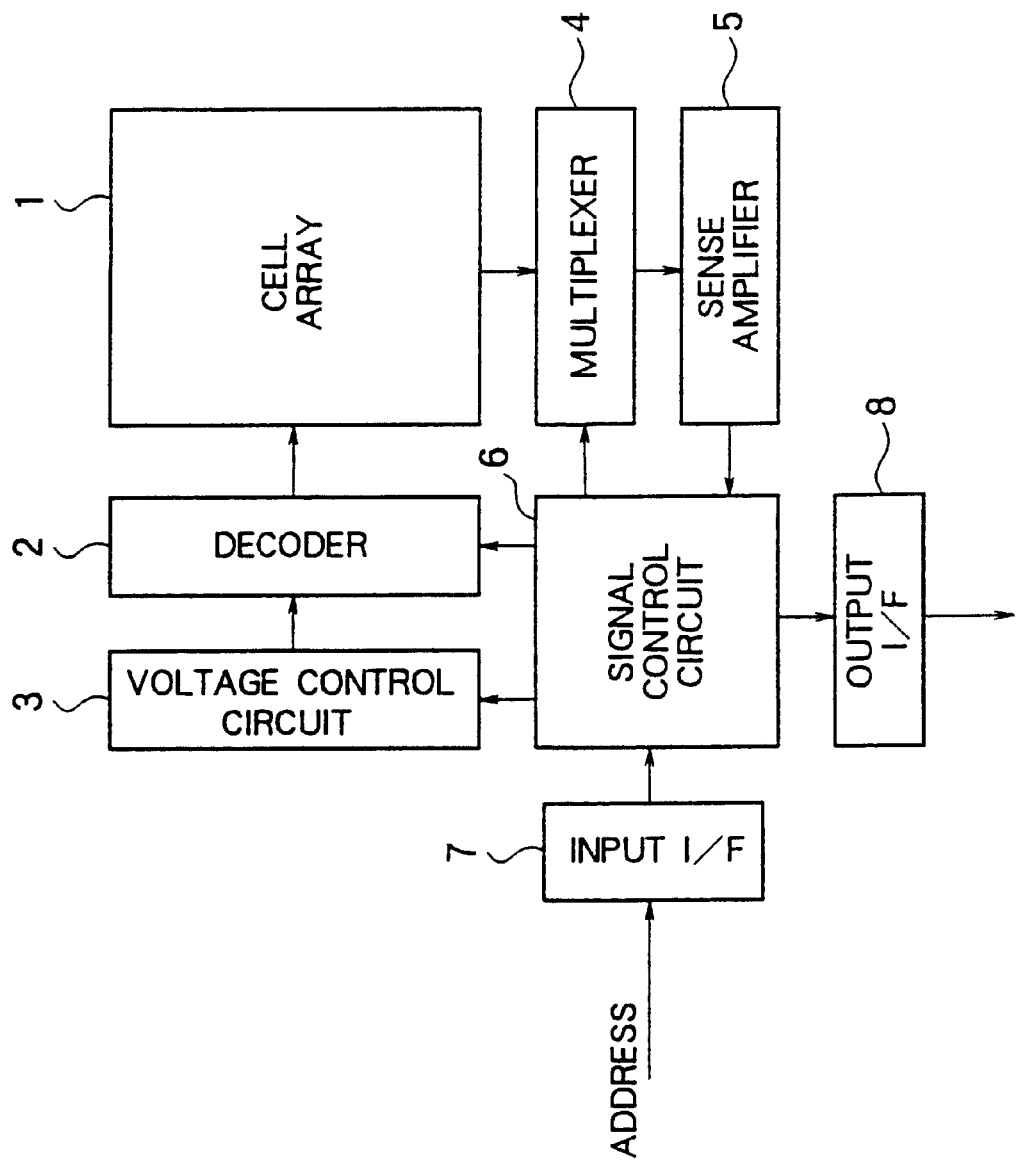
FIG. 2 is a block diagram showing the main structure of an EEPROM used in the first embodiment of the present invention.
Figure 6A:
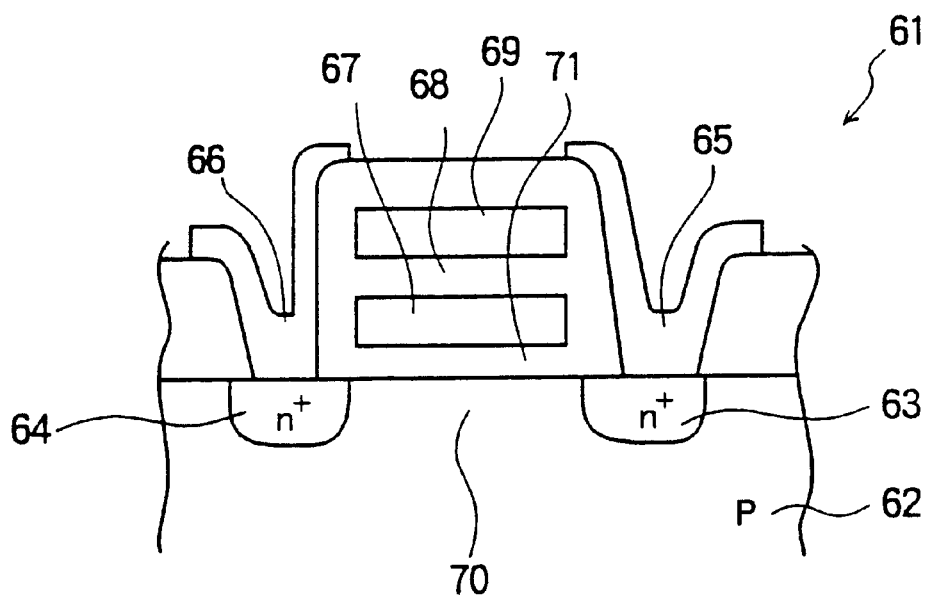
FIG. 6A is a schematic sectional view of a conventional floating gate type memory cell.
Figure 6B:
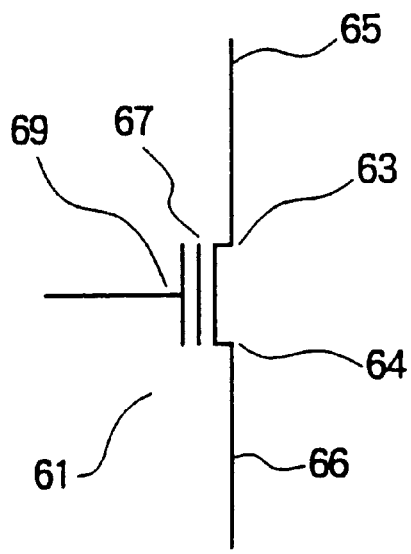
FIG. 6B is a connection diagram of the floating gate type memory cell.

Referring now to FIG. 2, there is shown the main structure of a semiconductor storage device to which the present invention is applied. In this drawing, the reference numeral 1 designates a cell array which has a plurality of memory cells arranged lengthwise wise and widthwise in the form of a matrix not shown. Each of these memory cells is a floating gate type memory cell having substantially the same structure as that described with reference to FIGS. 6A and 6B. Though not shown, control gates, drains and sources of the memory cells are connected to word lines, to bit lines and to a common source line, respectively. The word lines are arranged in the direction of the columns of the cell array and connected to a decoder 2. On the other hand, the bit lines are arranged in the direction of the rows of the cell array and connected to a multiplexer 4. The sources are grounded. Through the decoder 2, a voltage control circuit 3 applies a predetermined voltage value to a word line selected from the plurality of word lines in the cell array.

The multiplexer 4 supplies the voltage value of the selected bit line in the cell array to a sense amplifier 5. The sense amplifier 5 detects the presence or absence of the selected bit line and supplies the result of detection to a signal control circuit 6. The signal control circuit 6 receives data supplied from the outside through an input interface (I/F) 7 as an address signal, determines the word line and bit line to be selected on the basis of this address signal and supplies the results of determination to the decoder 2 and to the multiplexer 4, respectively. Further, a voltage value to be next applied to the control gate of the selected memory cell is determined on the basis of the result of detection in the sense amplifier 5, so that a result of the determination is supplied to the voltage control circuit 3. Further, data in the selected memory cell is supplied to the outside through an output I/F 8.

The operation of this embodiment configured as described above will be described below. In the case of reading operation, an address signal from the outside is inputted into the signal control circuit 6 through the input I/F 7. Upon reception of the address signal, the signal control circuit 6 determines a word line and a bit line to be selected in the cell array on the basis of the supplied address signal and supplies the results of determination as instructions to the decoder 2 and the multiplexer 4, respectively. The decoder 2 and the multiplexer 4 select the word line and the bit line, respectively, on the basis of these instructions. Further, the signal control circuit 6 determines the magnitude of a voltage to be applied to the control gate of the selected memory cell and supplies the result of determination as an instruction to the voltage control circuit 3. The voltage control circuit 3 applies a predetermined voltage to the selected word line through the decoder 2. On the other hand, a predetermined voltage is applied to the selected bit line by the multiplexer 4. As a result, whether a current flows in the selected bit line or not is determined in accordance with the state of the threshold value of the selected memory cell. The state of the current in the selected bit line is transmitted from the multiplexer 4 to the sense amplifier 5. The sense amplifier 5 detects the presence or absence of the current in the selected bit line and transmits the result of detection to the signal control circuit 6. The signal control circuit 6 determines a voltage to be next applied to the control gate of the selected memory cell on the basis of the result of the detection in the sense amplifier 5 and supplies the result of determination as an instruction to the voltage control circuit 3. Further, the signal control circuit 6 outputs, through the output I/F 8, the storage data of the selected memory cell finally obtained by repeating the aforementioned procedure.

Figure 1:
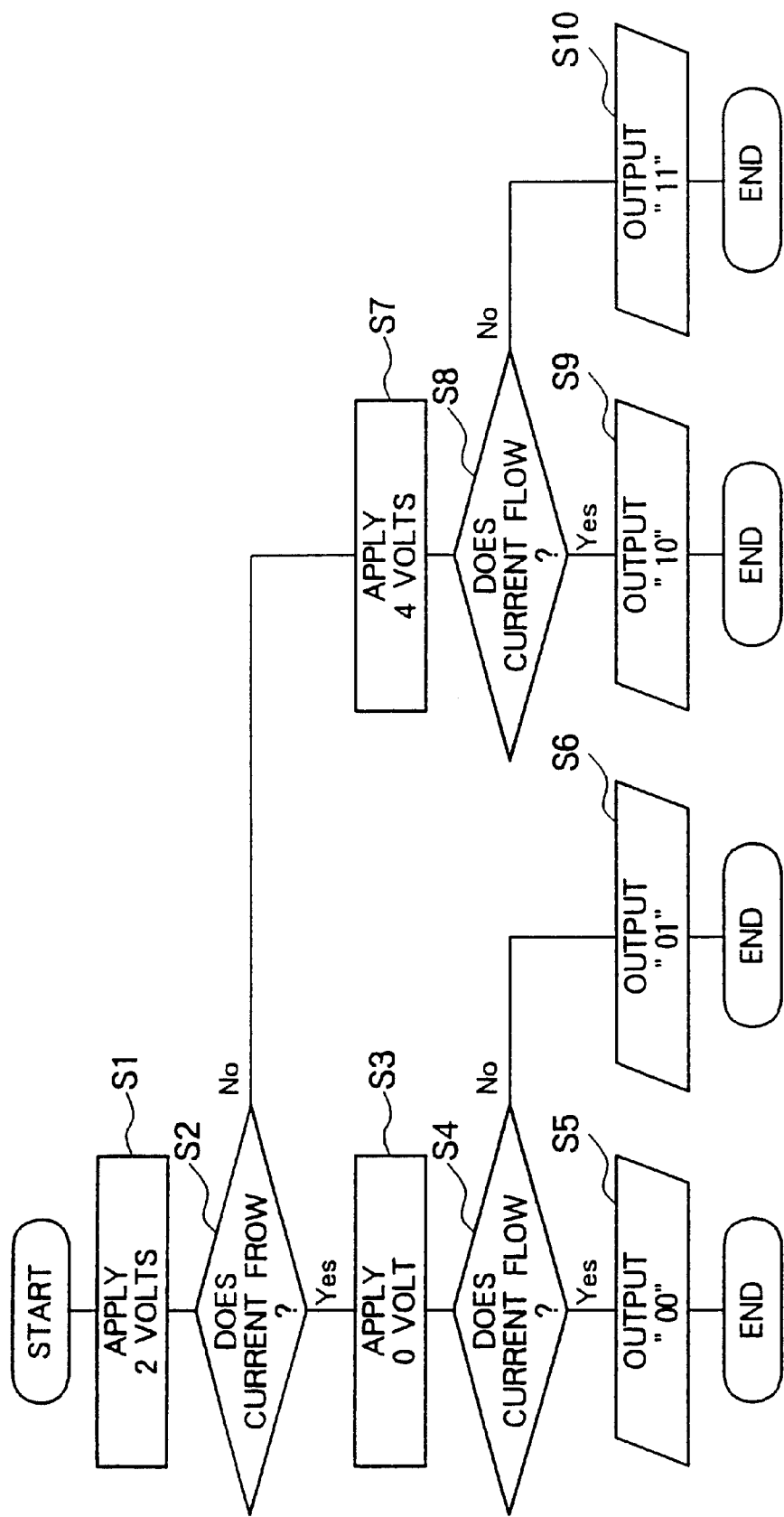
FIG. 1 is a flow chart of a reading method according to a first embodiment of the present invention.

FIG. 1 shows a flow chart of reading operation according to the first embodiment of the present invention. In this embodiment, assume that the gate voltage of each of the memory cells takes any one of the threshold values −1 V, 1 V, 3 V and 5 V. That is, assume that each memory cell has a storage capacity of two bits (=four values).

First, the signal control circuit 6 instructs the voltage control circuit 3 to apply a voltage of 2 V to the control gate of the selected memory cell. In this occasion, a voltage of 5 V is applied to the drain (step S1).

Then, it is detected whether a current flows across the drain and source of the selected memory cell through the selected bit line and the sense amplifier 5 (step S2).

When it is confirmed in the step S2 that a current flows across the drain and source of the selected memory cell, that is, when current conduction is made in the selected memory cell, the threshold value of the gate voltage of the memory cell is judged to be either −1 V or 1 V, so that the signal control circuit 6 instructs the voltage control circuit 3 to apply a voltage of 0 V to the control gate of the selected memory cell nextly (step S3).

Then, it is detected whether a current flows across the drain and source of the selected memory cell (step S4). When a current flows, the threshold value of the gate voltage of the memory cell is judged to be −1 V, so that "00" as storage data of the memory cell is outputted through the output I/F 8 (step S5). When it is otherwise confirmed in the step S4 that no current flows, the threshold value of the gate voltage of the memory cell is judged to be 1 V, so that "01" as storage data of the memory cell is outputted (step S6).

When it is confirmed in the step S2 that no current flows across the drain and source of the selected memory cell, the threshold value of the gate voltage of the memory cell is judged to be either 3 V or 5 V, so that the signal control circuit 6 instructs the voltage control circuit 3 to apply next a voltage of 4 V to the control gate of the selected memory cell (step S7).

Then, it is detected whether a current flows across the drain and source of the selected memory cell is (step S8). When a current flows, the threshold value of the gate voltage of the memory cell is judged to be 3 V, so that "10" as storage data of the memory cell is outputted through the output I/F 8 (step S9). When it is confirmed in the step S8 that no current flows, the threshold value of the gate voltage of the memory cell is judged to be 5 V, so that "11" as storage data of the memory cell is outputted (step S10).

As described above, according to the reading method of this embodiment, reading of data from one memory cell having a storage capacity of two bits can be performed by two times reading operation. Although the conventional method requires three times reading operation by application of all voltages 0 V, 2 V and 4 V, the number of times of necessary reading operation is reduced according to the method of this embodiment. Accordingly, access time can be reduced.

Figure 3:
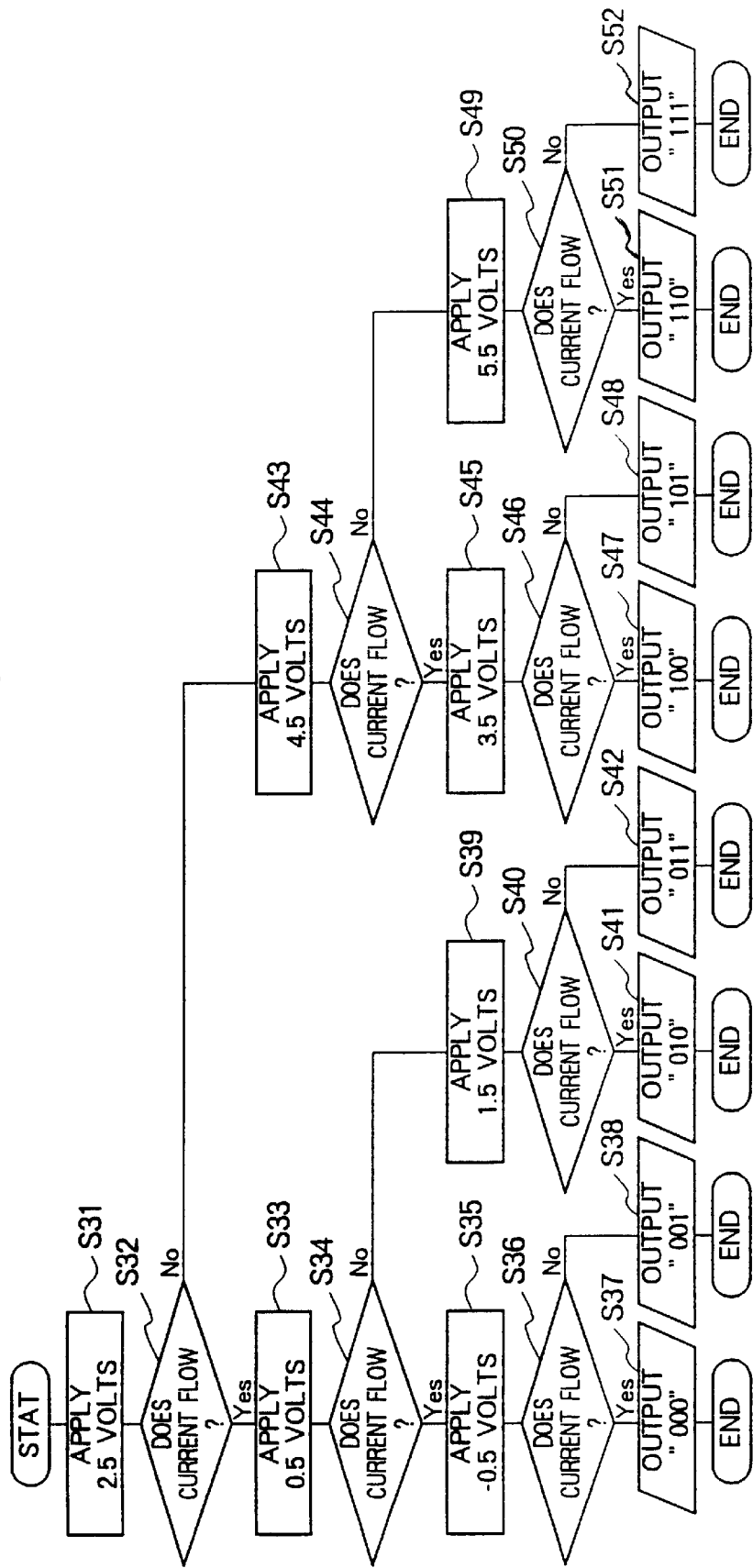
FIG. 3 is a flow chart of a reading method according to a second embodiment of the present invention.

Referring to FIG. 3, a second embodiment of the present invention will be described below. In this embodiment, the gate voltage of each of the memory cells takes any one of threshold values −1 V, 0 V, 1 V, 2 V, 3 V, 4 V, 5 V and 6 V. That is, each of the memory cells has a storage capacity of three bits (=eight values).

First, the signal control circuit 6 instructs the voltage control circuit 3 to apply a voltage of 2.5 V to the control gate of a selected memory cell. In this occasion, a voltage of 5 V is applied to the drain of the selected memory cell (step 331).

Then, it is detected whether a current flows across the drain and source of the selected memory cell through the selected bit line and the sense amplifier 5 (step S32).

When it is confirmed in the step S32 that a current flows across the drain and source of the selected memory cell, that is, when current conduction is made in the selected memory cell, the threshold value of the gate voltage of the memory cell is judged to be either −1 V or 2 V, so that the signal control circuit 6 instructs the voltage control circuit 3 to apply next a voltage of 0.5 V to the control gate of the selected memory cell (step S33).

Then, it is detected whether a current flows across the drain and source of the selected memory cell (step S34).

When it is confirmed in the step S34 that a current flows across the drain and source of the selected memory cell, the threshold value of the gate voltage of the memory cell is judged to be either −1 V or 0 V, so that the signal control circuit 6 instructs the voltage control circuit 3 to apply a voltage of 0.5 V to the control gate of the selected memory cell (step S35).

Then, whether a current flows across the drain and source of the selected memory cell (step S36). When a current flows, the threshold value of the gate voltage of the memory cell is judged to be −1 V, so that "000" as storage data of the memory cell is outputted through the output I/F 8 (step S37). When it is otherwise confirmed in the step S36 that no current flows, the threshold value of the gate voltage of the memory cell is judged to be 0 V, so that "001" as storage data of the memory cell is outputted (step S38).

When it is confirmed in the step S34 that no current flows across the drain and source of the selected memory cell, the threshold value of the gate voltage of the memory cell is judged to be either 1 V or 2 V, so that the signal control circuit 6 instructs the voltage control circuit 3 to apply a voltage of 1.5 V to the control gate of the selected memory cell (step S39).

Then, it is detected whether a current flows across the drain and source of the selected memory cell (step S40). When a current flows, the threshold value of the gate voltage of the memory cell is judged to be 1 V, so that "010" as storage data of the memory cell is outputted through the output I/F 8 (step S41). When it is confirmed in the step S40 that no current flows, the threshold value of 15 the gate voltage of the memory cell is judged to be 2 V, so that "011" as storage data of the memory cell is outputted (step S42).

When it is confirmed in the step S32 that no current flows across the drain and source of the selected memory cell, the threshold value of the gate voltage of the memory cell is judged to be any one of values 3 V to 6 V, so that the signal control circuit 6 instructs the voltage control circuit 3 to apply next a voltage of 4.5 V to the control gate of the selected memory cell (step S43).

Then, it is detected whether a current flows across the drain and source of the selected memory cell (step S44).

When it is confirmed in the step S44 that a current flows across the drain and source of the selected memory cell, the threshold value of the gate voltage of the memory cell is judged to be either 3 V or 4 V, so that the signal control circuit 6 instructs the voltage control circuit 3 to apply next a voltage of 3.5 V to the control gate of the selected memory cell (step S45).

Then, it is detected whether a current flows across the drain and source of the selected memory cell (step S46). When a current flows, the threshold value of the gate voltage of the memory cell is judged to be 3 V, so that "100" as storage data of the memory cell is outputted through the output I/F 8 (step S47). When it is confirmed in the step S46 that no current flows, the threshold value of the gate voltage of the memory cell is judged to be 4 V, so that "101" as storage data of the memory cell is outputted (step S48).

When it is confirmed in the step S44 that no current flows across the drain and source of the selected memory cell, the threshold value of the gate voltage of the memory cell is judged to be either 5 V or 6 V, so that the signal control circuit 6 instructs the voltage control circuit 3 to apply next a voltage of 5.5 V to the control gate of the selected memory cell (step Then, whether a current flows across the drain and source of the selected memory cell (step S50). When a current flows, the threshold value of the gate voltage of the memory cell is judged to be 5 V, so that "110" as storage data of the memory cell is outputted through the output I/F 8 (step S51).

When it is confirmed in the step S50 that no current flows, the threshold value of the gate voltage of the memory cell is judged to be 6 V, so that "111" as storage data of the memory cell is outputted (step S52).

As described above, according to the reading method of this embodiment, reading of data from one memory cell having a storage capacity of three bits can be performed by three times of reading operation, so that the number of times of necessary reading operation is reduced greatly. As a result, access time can be shortened greatly.

Figure 4:
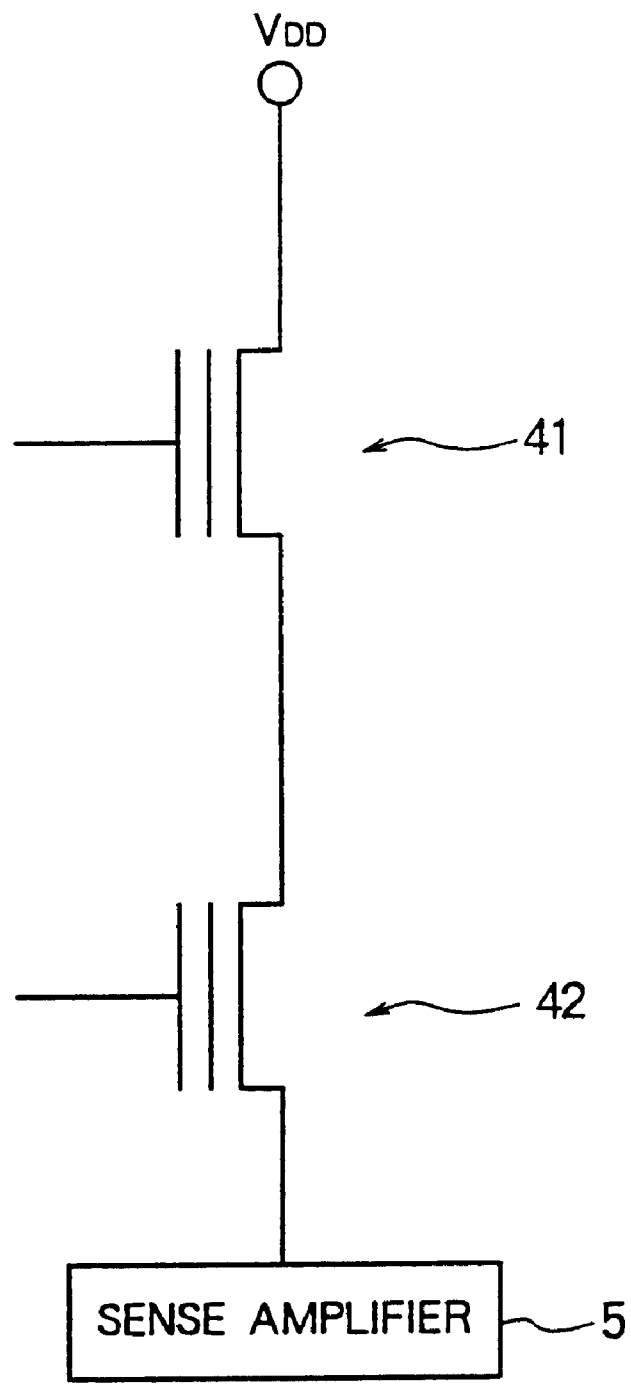
FIG. 4 is a schematic connection diagram showing an NAND type block used in a third embodiment of the present invention and having two memory cells series-connected.
Figure 5:
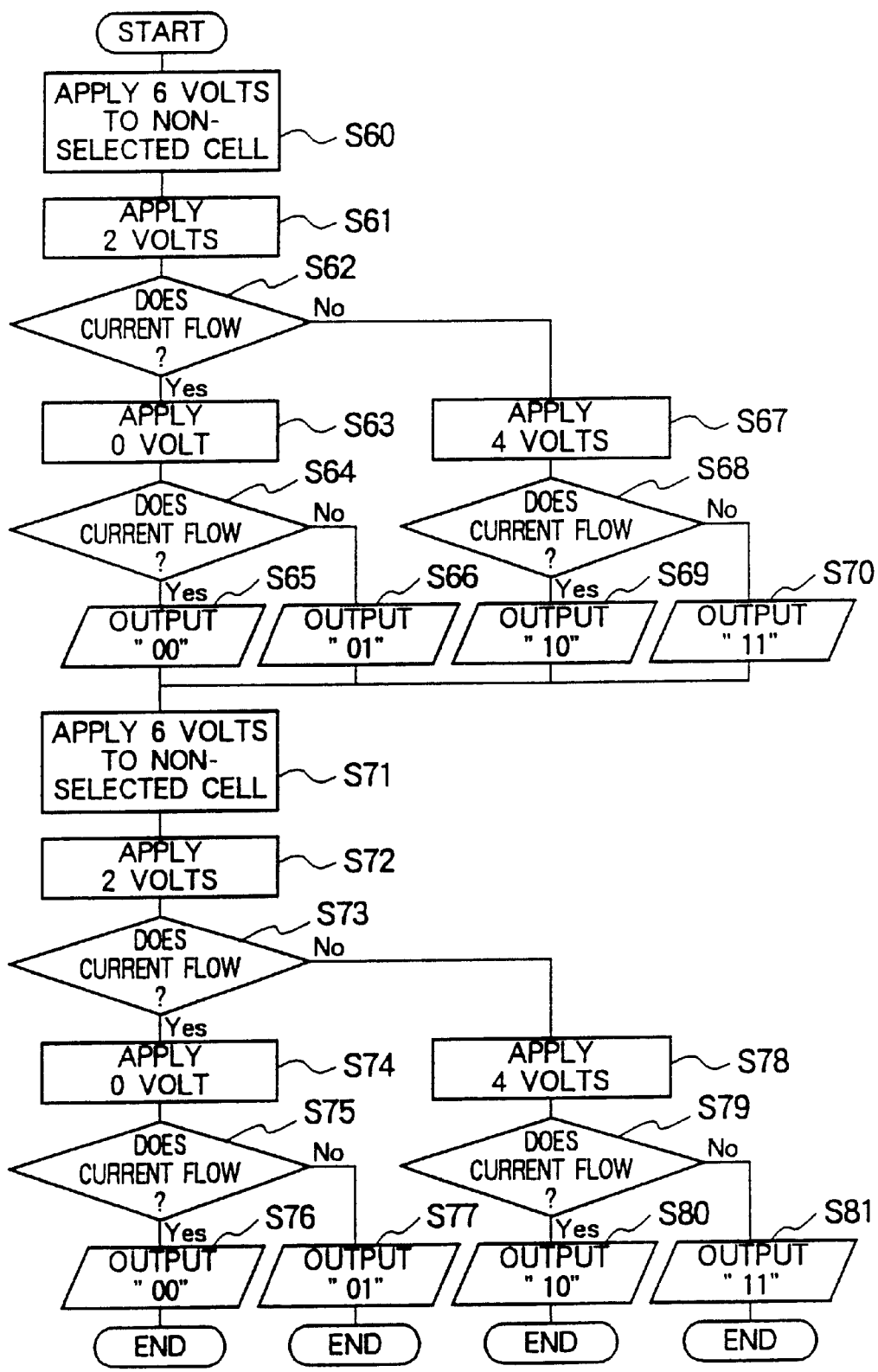
FIG. 5 is a flow chart of a reading method according to the third embodiment of the present invention.

Referring to FIGS. 4 and 5, a third embodiment of the present invention will be described below.

As shown in FIG. 4, in this embodiment, reading is made from an NAND type block having two memory cells 41 and 42 series-connected and each having a storage capacity of two bits. The gate voltage of each of the memory cells takes any one of threshold values −1 V, 1 V, 3 V and 5 V. In this embodiment, higher significant two bits and lower significant two bits are stored in the memory cells 41 and 42, respectively, so that information of four bits in total is stored in the two memory cells.

FIG. 5 is a flow chart of reading operation. In order to read information of higher significant two bits stored in a memory cell 41, a voltage of 6 V is applied to the gate of a non-selected memory cell 42 (step S60) so that the memory cell 42 is turned to a current conduction state even in the case where the threshold value of the gate voltage is any one of values −1 V, 1 V, 3 V and 5 V.

The method of reading data from the selected memory cell 41 in this condition is the same as that described previously in the first embodiment. That is, a voltage of 2 V is applied to the control gate of the selected memory cell 41 (step S61) and whether a current flows in a corresponding bit line or not is detected by the sense amplifier 5 to thereby detect whether current conduction is made in the selected memory cell 41 (step S62). Incidentally, the input potential of the sense amplifier 5 is set to be 0 V and a voltage of 5 V is applied to the drain terminal $V_{DD}$ of the memory cell 41.

When it is confirmed in the step S62 that current conduction is made in the selected memory cell 41, the threshold value of the gate voltage of the selected memory cell 41 is judged to be either −1 V or 1 V, so that a voltage of 0 V is applied next to the control gate of the selected memory cell 41 (step S63) to detect whether current conduction is made in the selected memory cell 41 (step S64). When it is confirmed in the step S64 that current conduction is made in the selected memory cell 41, the threshold value of the gate voltage of the selected memory cell 41 is judged to be −1 V, so that "00" as higher significant bit data is outputted (step S65). When it is confirmed in the step S64 that current conduction is not made in the selected memory cell 41, the threshold value of the gate voltage of the selected memory cell 41 is judged to be 1 V, so that "01" as higher significant bit data is outputted (step S66).

When it is confirmed in the step S62 that current conduction is not made in the selected memory cell 41, the threshold value of the gate voltage of the selected memory cell 41 is judged to be either 3 V or 5 V, so that a voltage of 4 V is applied next to the control gate of the selected memory cell 41 (step S37) to detect whether current conduction is made in the selected memory cell 41 (step S68). When it is confirmed in the step S68 that current conduction is made in the selected memory cell 41, the threshold value of the gate voltage of the selected memory cell 41 is judged to be 3 V, so that "10" as higher significant bit data is outputted (step S69). When it is confirmed in the step S68 that current conduction is not made in the selected memory cell 41, the threshold value of the gate voltage of the selected memory cell 41 is judged to be 5 V, so that "11" as higher significant bit data is outputted (step S70).

Then, information of lower significant two bits stored in the memory cell 42 is to be read out. In order to read the information, a voltage of 6 V is applied to the gate of the non-selected memory cell 41 (step S71) so that the non-selected memory cell 41 is turned to a current conduction state.

Further, a voltage of 2 V is applied to the control gate of the selected memory cell 42 (step S72) and whether a current flows in a corresponding bit line is detected by the sense amplifier 5 to thereby detect whether current conduction is made in the selected memory cell 42 or not (step S73).

When it is confirmed in the step S73 that current conduction is made in the selected memory cell 42, the threshold value of the gate voltage of the selected memory cell 42 is judged to be either −1 V or 1 V, so that a voltage of 0 V is applied next to the control gate of the selected memory cell 42 (step S74) to detect whether current conduction is made in the selected memory cell 42 or not (step S75). When it is confirmed in the step S75 that current conduction is made in the selected memory cell 42, the threshold value of the gate voltage of the selected memory cell 42 is judged to be −1 V, so that "00" as lower significant bit data is outputted (step S76). When it is confirmed in the step S75 that current conduction is not made in the selected memory cell 42, the threshold value of the gate voltage of the selected memory cell 42 is judged to be 1 V, so that "01" as lower significant bit data is outputted (step S77).

When it is confirmed in the step S73 that current conduction is not made in the selected memory cell 42, the threshold value of the gate voltage of the selected memory cell 42 is judged to be either 3 V or 5 V, so that a voltage of 4 V is applied next to the control gate of the selected memory cell 42 (step S78) to detect whether current conduction is made in the selected memory cell 42 (step S79). When it is confirmed in the step S79 that current conduction is made in the selected memory cell 42, the threshold value of the gate voltage of the selected memory cell 42 is judged to be 3 V, so that "10" as lower significant bit data is outputted (step S80). When it is confirmed in the step S79 that current conduction is not made in the selected memory cell 42, the threshold value of the gate voltage of the selected memory cell 42 is judged to be 5 V, so that "11" as lower significant bit data is outputted (step S81).

As described above, according to the reading method of this embodiment, data of four bits stored in two memory cells can be read out thoroughly by four times reading operation.

Although the present invention has been described upon the case where multi-valued storage is performed by an EEPROM having floating gate type memory cells, it is to be understood that not only floating gate type memory cells but also other type memory cells such as NMOS type memory cells may be used as memory cells for performing multi-valued storage.

The present invention can be also applied to a reading method in the case where multi-valued storage is performed by another storage device such as an EPROM or a PROM than the EEPROM and can be further applied to a reading method in the case where multi-valued storage is performed by a mask ROM in which, for example, the quantity of impurities ion-injected into the channel region of a field-effect transistor is controlled to thereby change the threshold value to obtain the storage state.

Although the aforementioned embodiments have shown the case where a storage capacity of two or three bits is given to one memory cell, it is to be understood that the present invention can be applied to the all case where a storage capacity of four values (two bits) or more is given to one memory cell and that the present invention is more effective as the storage capacity increases.

According to the reading method of the present invention, the number of times of reading operation subjected to each memory cell in a semiconductor storage device constituted by memory cells each having a storage capacity of four values or more is reduced, so that access time can be shortened.

What is claimed is:

1. In a memory device including at least one transistor having a gate, a drain, and a source and constituting a memory cell of a non-volatile type having a threshold voltage level, a sensing circuit for determining a state of the memory cell, the sensing circuit comprising:

a first reference corresponding to a first threshold voltage level;

a first comparing means coupled to said memory cell and to said first reference, said first comparing means for comparing said threshold voltage level of said memory cell to said first reference, and for outputting a first result;

a second reference corresponding to a second threshold voltage level;

a third reference corresponding to a third threshold voltage level;

a second comparing means coupled to said memory cell and a selected one of said second reference and said third reference, said second comparing means for comparing said threshold voltage level of said memory cell to said selected one of said second reference and said third reference, and for outputting a second result; and a selector circuit coupled for receiving said first result, said selector circuit for selectively coupling said one of said second reference and said third reference to said second comparator in response to said first result.

2. A sensing circuit according to claim 1, wherein said memory cell is a non-volatile memory cell having a floating gate for storing charge.

3. A sensing circuit according to claim 1, wherein said threshold voltage level of said cell indicates one of n possible states, where n is an integer greater than 2, each state corresponding to a predetermined range of charge levels.

4. A sensing circuit according to claim 3, wherein a number of references is equal to n−1.

5. A sensing circuit according to claim 3, wherein said second comparing means compares said threshold voltage level of said transistor to said second reference if said threshold voltage level of said transistor is less than said first reference, and compares said threshold voltage level of said transistor to said third reference if said threshold voltage level of said transistor is greater than said first reference.

6. A sensing circuit according to claim 3, wherein n is equal to four, the circuit further comprising means for indicating:

that said memory cell is in a first state if said threshold voltage level is determined by said first and second comparing means as being less than both of said first and second references;

that said memory cell is in a second state if said threshold voltage level is determined by said first and second comparing means as being less than said first reference and greater than said second reference;

that said memory cell is in a third state if said threshold voltage level is determined by said first and second comparing means as being greater than said first reference and less than said third reference; and that said memory cell is in a fourth state if said threshold voltage level is determined by said first and second comparing means as being greater than both said first and third references.

7. A sensing circuit according to claim 1, wherein said second comparing means compares said threshold voltage level of said transistor to said second reference if said threshold voltage level is less than the first reference, and compares said threshold voltage level to said third reference if said threshold voltage level is greater than said first reference.

8. A sensing circuit according to claim 3, wherein said first reference corresponds to a threshold voltage level between a n/2 state and a (n/2+1) state.

9. A sensing circuit according to claim 3, wherein said second reference corresponds to a threshold voltage level between a n/4 state and a (n/4+1) state.

10. A sensing circuit according to claim 3, wherein said third reference corresponds to a threshold voltage level between a 3n/4 state and a (3n/4+1) state.

11. A sensing circuit according to claim 1, wherein each of said first and second results from the first and second comparing means is expressed using a single binary bit.

12. A sensing circuit according to claim 3, wherein n is equal to either four or eight.

13. A sensing circuit according to claim 1, wherein said transistor further has an electric charge accumulating layer which serves as a floating gate, an amount of electric charge accumulated in said electric charge accumulating layer being controlled so as to control a threshold value of a gate voltage of said transistor to be one of three or more different values.

14. A sensing circuit according to claim 1, wherein an amount of impurities implanted into channel regions of the transistor included in said memory cell is controlled so as to control said threshold voltage level of said transistor to be one of three or more different values.

15. A sensing circuit according to claim 1, wherein said memory cell includes a selected one of EEPROM (electrically erasable programmable read only memory), EPROM (erasable programmable read only memory) and PROM (programmable read only memory).

16. A sensing circuit according to claim 1, wherein said reference is a constant voltage source.

17. A sensing circuit according to claim 1, wherein said gate of said transistor is a control gate.

18. A sensing circuit according to claim 1, wherein said at least one transistor includes two transistors connected serially to each other and constituting memory cells, respectively.

19. A sensing circuit according to claim 1, wherein said memory device includes a plurality of transistors connected serially to each other.

20. A semiconductor storage device comprising:

at least one transistor having a gate, a drain and a source and constituting a memory cell of a non-volatile type having a cell charge level;

sensing means for sensing said cell charge level of said memory cell; and comparing means for comparing said cell charge level of said memory cell to a first reference and outputting a first result thereof, and for comparing said cell charge level of said memory cell to a selected one of a second reference and a third reference and outputting a second result thereof;

wherein selection between said second and third references is done in accordance with said first result.

21. A semiconductor storage device according to claim 20, wherein said cell charge level indicates one of n possible states, where n is an integer greater than 2, each state corresponding to a predetermined range of charge levels.

22. A semiconductor storage device according to claim 21, wherein said cell charge level is representative of a threshold level of said at least one transistor.

23. A semiconductor storage device according to claim 21, wherein a number of references is equal to n−1.

24. A semiconductor storage device according to claim 21, wherein said first reference corresponds to a cell charge level between a n/2 state and a (n/2+1) state.

25. A semiconductor storage device according to claim 21, wherein said second reference corresponds to a cell charge level between a n/4 state and a (n/4+1) state.

26. A semiconductor storage device according to claim 21, wherein said third reference corresponds to a cell charge level between a 3n/4 state and a (3n/4+1) state.

27. A semiconductor storage device according to claim 21, wherein said first and second results are each expressed using a single binary bit.

28. A semiconductor storage device according to claim 21, wherein n is equal to four.

29. A semiconductor storage device according to claim 20, comprising a plurality of transistors connected serially to each other.

30. A semiconductor storage device according to claim 20, wherein said memory cell includes a selected one of EEPROM (electrically erasable programmable read only memory), EPROM (erasable programmable read only memory) and PROM (programmable read only memory).

31. A semiconductor storage device comprising:

at least one transistor having a gate, a drain and a source and constituting a multi-valued memory cell of a non-volatile type for storing data in correspondence to one selected from at least three different threshold values;

a first determining means for dividing said at least three different threshold values into a first threshold value group including a plurality of threshold values and a second threshold value group including at least one threshold value other than the first threshold value group and determining whether said data belongs to the first threshold value group or the second threshold value group; and a second determining means for determining which threshold value included in one of the first and second threshold value groups determined by said first determining means corresponds to said data when the determined threshold value group includes a plurality of threshold values.

32. A semiconductor storage device according to claim 31, wherein said first and second determining means are constructed of a voltage control circuit, a sense amplifier and a signal control circuit.

33. A semiconductor storage device according to claim 31, wherein said first determining means divides said at least three different threshold values in accordance with magnitude thereof into the first and second threshold value groups so that a number of threshold values included in the first threshold value group and a number of threshold values included in the second threshold value group are equal to each other or differ by one.

34. A semiconductor storage device according to claim 31, wherein said second determining means includes:

third determining means for dividing threshold values included in one of the first and second threshold value groups determined by said first determining means into third and fourth threshold value groups so that a number of threshold values included in the third threshold value group and a number of threshold values included in the fourth threshold value group are equal to each other or differ by one and determining whether said data belongs to the third threshold value group or the fourth threshold value group; and fourth determining means for determining which threshold value included in one of the third and fourth threshold value groups determined by said third determining means corresponds to said data when the determined threshold group includes a plurality of threshold values.

35. A semiconductor storage device according to claim 33, wherein:

said at least one transistor has a control gate and an electric charge accumulating layer; and each of said first and second determining means sequentially applies a voltage having a value determined on the basis of the threshold values included in respective threshold value groups to said control gate of said at least one transistor to detect whether or not a current flows across a drain and a source of said at least one transistor.

36. A semiconductor storage device according to claim 34, wherein:

said at least one transistor has a control gate and an electric charge accumulating layer; and each of said first, third and fourth determining means sequentially applies a voltage having a value determined on the basis of the threshold values included in respective threshold value groups to said control gate of said at least one transistor to detect whether or not a current flows across a drain and a source of said at least one transistor.

37. A semiconductor storage device according to claim 31, wherein said at least one transistor has a control gate and an electric charge accumulating layer which serves as a floating gate, an amount of electric charge accumulated in said electric charge accumulating layer being controlled so as to control a threshold value of a gate voltage of said transistor to be one of said at least three different threshold values.

38. A semiconductor storage device according to claim 31, wherein an amount of impurities implanted into channel regions of said at least one transistor is controlled so as to control a threshold value of a gate voltage of said at least one transistor to be one of said at least three different threshold values.

39. A semiconductor storage device according to claim 31, wherein said at least one transistor includes a plurality of transistors connected serially to each other and constituting multi-valued memory cells, respectively.

40. A semiconductor storage device according to claim 31, wherein said multi-valued memory cell includes a selected one of EEPROM (electrically erasable programmable read only memory), EPROM (erasable programmable read only memory) and PROM (programmable read only memory).

41. A semiconductor storage device according to claim 31, wherein said multi-valued memory cell is a non-volatile memory cell having a floating gate for storing charge.

* * * * *